United States Patent [19]

Providenza et al.

[11] Patent Number: 5,487,051
[45] Date of Patent: Jan. 23, 1996

[54] IMAGE PROCESSOR MEMORY FOR EXPEDITING MEMORY OPERATIONS

[75] Inventors: John R. Providenza, Beaverton; Lee Boekelheide, Tigard, both of Oreg.

[73] Assignee: Network Computing Devices, Inc., Mountain View, Calif.

[21] Appl. No.: 210,355

[22] Filed: Mar. 18, 1994

Related U.S. Application Data

[62] Division of Ser. No. 77,705, Jun. 14, 1993, Pat. No. 5,345,555, Continuation of Ser. No. 617,359, Nov. 23, 1990.

[51] Int. Cl.$^6$ .................................................. G11C 13/00
[52] U.S. Cl. ............................................ 365/233; 365/193
[58] Field of Search ..................................... 365/106, 118, 365/128, 189.01, 189.02, 189.04, 189.05, 193, 233, 239

[56] References Cited

U.S. PATENT DOCUMENTS

| | | | |
|---|---|---|---|
| 3,737,879 | 6/1973 | Greene | 365/222 |
| 4,763,251 | 8/1988 | Kauffman, Jr. et al. | 364/200 |
| 4,808,986 | 2/1989 | Mansfield et al. | 346/799 |
| 4,816,817 | 3/1989 | Herrington | 340/801 |
| 4,823,286 | 4/1989 | Lumelsky et al. | 364/521 |
| 4,837,563 | 6/1989 | Mansfield et al. | 340/732 |
| 4,845,656 | 7/1989 | Nishibe et al. | 364/900 |
| 4,855,628 | 8/1989 | Jun | 365/154 |
| 4,860,248 | 8/1989 | Lumelsky | 395/163 |
| 4,897,636 | 1/1990 | Nishi et al. | 340/724 |
| 4,903,217 | 2/1990 | Gupta et al. | 395/166 |

*Primary Examiner*—Terrell W. Fears
*Attorney, Agent, or Firm*—Dellett and Walters

[57] ABSTRACT

An electronic data storage memory performs logic operations on the data values existing in its storage cells to eliminate the number of necessary memory accesses during bitblts. The time in which a bitblt can be completed in an image processing system is prolonged because of the number of memory cycles performed during a "raster operation". Thus, to reduce the number of necessary memory cycles, simple logic operations are performed in image processor memory so that a raster operation may take place without having to read, for example, the destination operand from memory. Since a bitblt performs a raster operation on each pixel in the bitblt block, the reduction in memory access time is proportional to the size of the bitblt block.

13 Claims, 10 Drawing Sheets

(SRC) XOR (DEST)=DEST_VAL

| SCR | DEST | DEST_VAL |
|-----|------|----------|
| 0 | 0 | 0 |
| 0 | 1 | 1 |
| 1 | 0 | 1 |
| 1 | 1 | 0 |

Fig.2

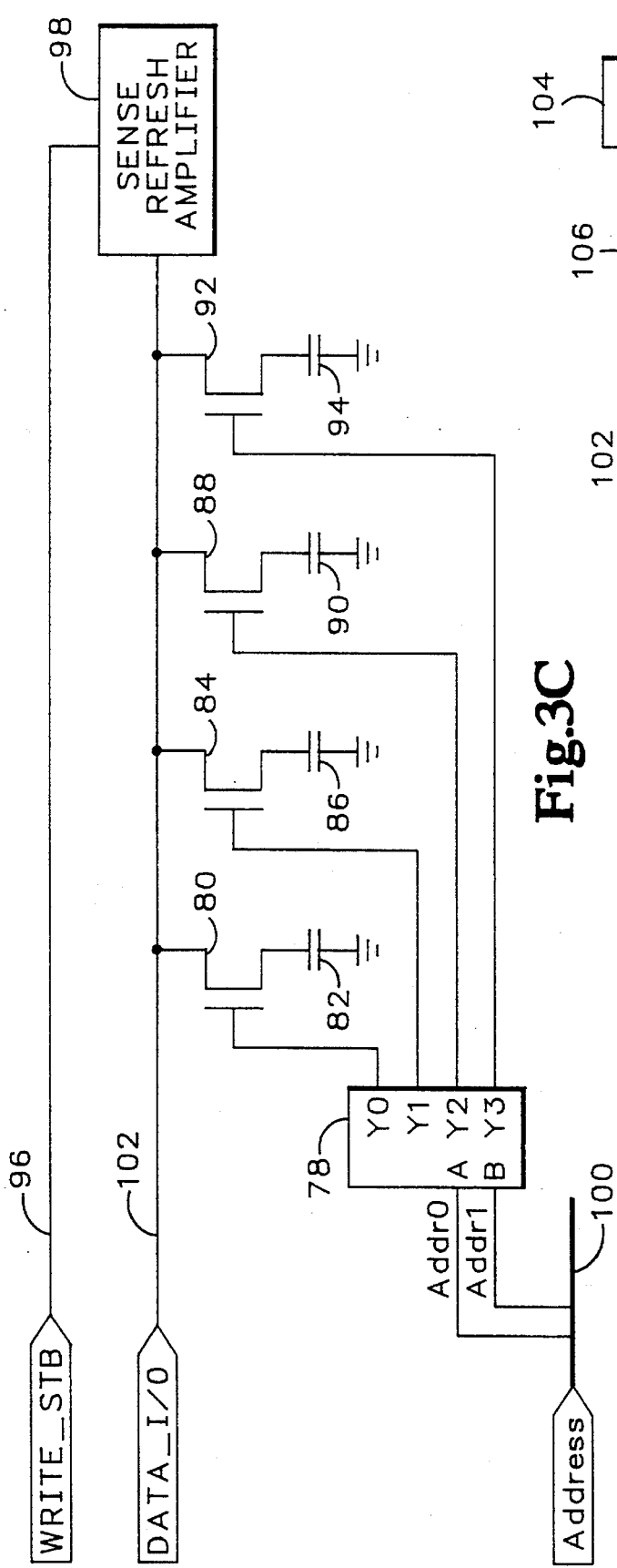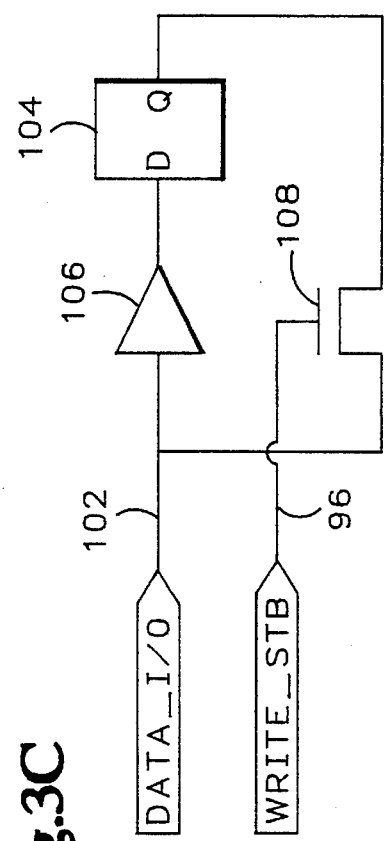
Fig.3C
Fig.3D

| DEST DECODE LOGIC | | |
|---|---|---|
| I/O_1 | I/O_0 | FUNCTION |
| 0 | 0 | CLR |
| 0 | 1 | TOGGLE |
| 1 | 0 | NO-OP |
| 1 | 1 | SET |

Fig.4

IMAGE PROCESSOR MEMORY FOR EXPEDITING MEMORY OPERATIONS

This is a divisional of application Ser. No. 08/077,705 filed on Jun. 14, 1993, now U.S. Pat. No. 5,345,555, issued Sep. 6, 1994, which was a continuation of application Ser. No. 07/617,359 filed on Nov. 23, 1990.

BACKGROUND OF THE INVENTION

The present invention relates to bit aligned block transfer (bitblt) and the hardware used to copy or move data from one area of memory to another within the display hardware of a computer system.

A standard architecture for display hardware includes an image control processor for creating, modifying and moving image data, an image storage system for holding the image data after being processed by the image control system, and an image display system for translating the stored image data to a visible image on a cathode-ray-tube (CRT). A standard image display system uses raster scanning to display stored image data. In a bit mapped system, the raster screen is treated as an array of picture elements (pixels) which have a controllable intensity and/or color. To control the pixel output on the screen, the image control processor modifies the data value in the associated image storage system address location.

The quality of the image displayed on the screen is improved by increasing the number of raster lines and the number of pixels displayed in each line. However, increasing the number of pixels increases the amount of time the image control processor takes to modify a screen of image data. When blocks of data are modified on a screen, the image processor must read the data value associated with each pixel located in the block, modify it accordingly, and write each pixel into a memory location. Therefore, the larger the block of data, the more time required for the image processor to update the screen. As the image resolution is increased, a given block of data contains more pixels and therefore takes longer to process. To reduce the time it takes the image processor to move and modify blocks of image data, special bitblt hardware has been developed. Bitblt hardware modifies data arrays faster than a general purpose image control processor and frees the general purpose processor to perform additional processing functions. Traditionally, a bitblt involves reading a data value from the image storage system, performing a "raster operation" on the data, and writing the result back, into the image storage system, this process being repeated for each pixel in the defined block to be modified. The raster operation generates modified data values by applying logic functions to the source and destination pixel values. Since the time required to perform the logic operation is usually less than the time required to move the data to and from the image storage system, these data transfers have become a major bottleneck in performing bitblt operations.

SUMMARY OF THE INVENTION

According to the present invention in a particular embodiment thereof, an electronic data storage memory performs logic operations on the data values existing in its storage cells to eliminate the number of necessary memory accesses during bitblts.

The time in which a bitblt can be completed in an image processing system is prolonged because of the number of memory cycles performed, a "raster operation" in a bitblt typically involving two or three operands that must be fetched from memory to determine a result. Thus, the traditional method of performing a bitblt with a two operand raster operation comprises reading the source operand, reading the destination operand, performing a logic operation between the two operands, and writing the result into the memory address of the destination operand. According to the present invention, simple logic operations are performed in image processor memory and a raster operation may take place without having to read, for example, the destination operand from memory. There are four basic logic operations that the bitblt RAM according to the present invention is capable of performing to eliminate a memory cycle associated with reading the destination operand, and inasmuch as the image storage system provides these operations, the raster operation sequence can be changed to reading the source operand, performing the logic operation, and modifying the destination operand to reflect the raster operation result, thereby eliminating one memory cycle. Since a bitblt performs a raster operation on each pixel in the bitblt block, the reduction in memory access time is proportional to the size of the bitblt block.

In employing the present invention, the number of memory cycles necessary to perform a bitblt can be reduced further by using the bitblt RAM in conjunction with special bitblt circuitry. According to the application Ser. No. 07/617,198, filed Nov. 23, 1990, now U.S. Pat. 5,313,576, issued May 17, 1994, and entitled SHORT CIRCUIT BLT, the number of memory cycles needed to perform a bitblt is minimized in an image display system that uses standard memories. However, when this bitblt hardware is employed in conjunction with the RAM in accordance with the present invention, the number of memory cycles needed is additionally reduced. The bitblt RAM circuit according to the present invention can be utilized in image systems that employ single or multiple bit pixel data, and the bitblt RAM memory array can also be implemented in various data word lengths to accommodate various system configurations. When a bitblt RAM circuit according to the present invention is used with a general purpose processor, the number of internal storage registers needed by the processor for the bitblt is reduced, a allowing the processor to conduct additional parallel functions.

The subject matter of the present invention is particularly pointed out and distinctly claimed in the concluding portion of this specification. However, both the organization and method of operation, together with further advantages and objects thereof, may best be understood by reference to the following description taken in connection with accompanying drawings wherein like reference characters refer to like elements.

BRIEF DESCRIPTION OF THE DRAWINGS

FIG. 2 is a truth table for a two operand raster operation, FIGS. 3C and 3D illustrate typical DRAM circuitry, FIG. 4 is a chart illustrating decode logic for I/O pins used to control the FIG. 3B RAM.

DETAILED DESCRIPTION

Figure 1:
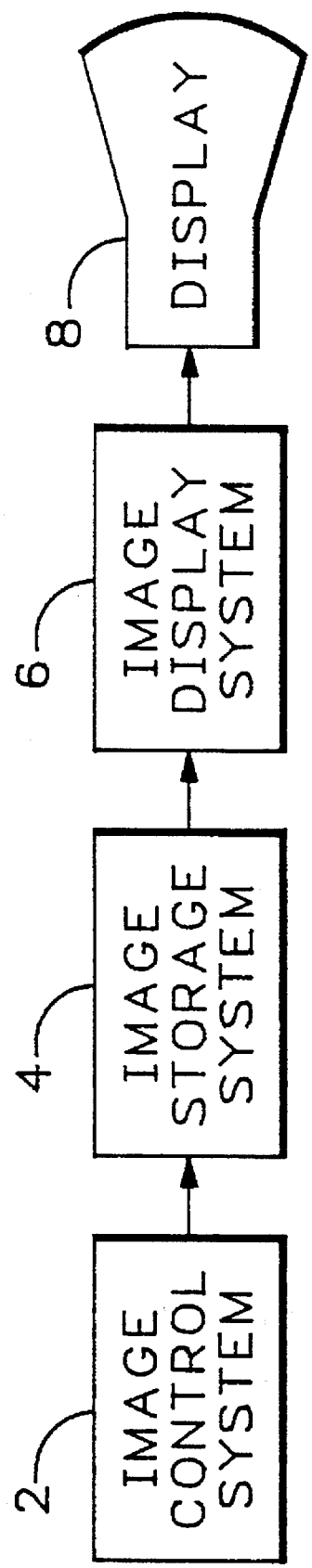
FIG. 1 is a block diagram for conventional architecture of a raster display system.

Referring to FIG. 1 illustrating the basic architecture of a raster display system, an image control processor 2 supplies address, data and control to image storage system 4 for manipulating pixel data. The information in image storage system 4 is translated by image display system 6 into signals for operating a control display screen comprising cathode-ray-tube (CRT) 8. The time required to output a screen of data to display system 8 is usually limited by the time taken by image control processor 2 to update a frame of data within image storage system 4. The operations that create and manipulate the image data in image storage system 4 are referred to as "raster operations", with there being several hundred raster operations typically performed on image data. A raster operation is exemplified by, $$(SRC) \text{ AND } (DEST) = DEST\_VAL \tag{1}$$

where SRC is the source pixel data, DEST is the destination pixel data, and DEST_VAL is the destination value generated as a result of a logical AND between the destination operand DEST and the source operand SRC. Traditionally, the raster operation above is conducted by the image control processor reading the source operand SRC from memory, loading it into a register, reading the destination operand DEST, loading it into a second register, ANDing the two register outputs, and then writing the destination value DEST_VAL back into the memory address of the destination operand. It is seen the raster operation in equation 1 takes three times as many clock cycles accessing memory as performing the logical AND operation. In addition, the memory read or write cycle is typically slow and more time consuming than a logic operation. Faster memory devices can reduce image processing time but they are limited by fabrication technology. A first purpose of the present invention is therefore to reduce the number of memory operations required in a raster operation.

When a raster operation is performed and the result is placed back into the address location of the destination operand, it will be seen that a limited number of logical variations exist between the new destination value and the previous destination operand. In accordance with the present invention the step of writing the raster operation result into the addressed location of the destination operand is replaced by performing an internal logic operation in the data cell where the destination operand is located so that it will equal the raster operation result. There are four logical operations that are applicable to the destination operand to reproduce any possible raster operation result, i.e., clear (DEST=0), set (DEST=1), complement (DEST=¯DEST), and no-op (DEST=DEST). Performing these four logic operations eliminates the need to read the destination operand from memory for a raster operation. For example, in equation 1, if SRC=0, the result will be zero regardless of the value of DEST or, $$0 \text{ and } (DEST) = 0.$$

In the same AND operation, if SRC=1, it can be seen the result will always be equal to the value of DEST or, $$1 \text{ AND } (DEST) = DEST.$$

Since the result of equation 1 is to be placed back into the memory address location of the destination operand, when the source operand is equal to zero, the value zero will replace the current value located in the destination operand memory location. Thus, if SRC=0, the raster operation result can be generated by clearing the value presently stored in the destination memory address. However, when SRC=1, the present value in the destination operand address location stays the same, or equivalently a no-op can be performed on the data value in the destination address location. For either value of the source operand used in equation 1 it is seen the result can be "generated" in the destination operand memory location without having to determine the destination operand value. Therefore, if a clear and no-op operation can be performed by the image storage system, the destination operand does not have to be read by the image control processor, eliminating one memory cycle needed to perform the raster operation in equation 1.

Equation 2 illustrates further how performing logic operations with a memory device can reduce the number of memory cycles in a raster operation. A typical raster operation involves performing an exclusive OR between the source operand and the destination operand, such as, $$(SRC) \text{ XOR } (DEST) = DEST\_VAL. \tag{2}$$

In equation 2, the destination value is one (DEST_VAL=1) if the source and destination operands are different and zero (DEST_VAL=0) if the source and destination operands are equal. FIG. 2 comprises a truth table for the raster operation between the source and destination operands according to an exclusive OR function wherein it can be seen that if SRC=0, the destination value is always equal to the destination operand or, $$0 \text{ XOR } (DEST) = DEST.$$

Therefore, a no-op can be performed on the value in the destination address location to generate the result of such raster operation. When SRC=1, it will also be seen from FIG. 2 that the destination value is equal to the complement of the destination operand value or, $$1 \text{ XOR } (DEST) = \bar{}DEST,$$

where ¯DEST represents the complement of DEST. Thus, to generate the result of an exclusive OR operation when the source operand equals one (SRC=1), the destination operand can be complemented or toggled. Therefore, the destination operand does not need to be read by the image control processor to determine the raster operation result where a no-op and a toggle can be performed by the image storage system.

The number of memory cycles can also be reduced in logic operations that contain more than two operands and it is another purpose of this invention to achieve memory cycle reduction in these instances. By way of example, pattern data is often used in combination with source and destination operands to fill in a defined area. As in the case of two operand raster operations, by performing four logic operations mentioned previously (clear, set, complement and no-op), any raster operation result can be generated from the destination operand. As a typical example of a raster operation involving pattern information, let $$DEST\_VAL = (\bar{}DEST \text{ AND } PAT) \text{ OR } (SRC \text{ AND } \bar{}PAT), \tag{3}$$

where SRC is the source memory operand, ¯DEST is the complement of the destination memory operand, PAT is a pattern memory operand, and DEST_VAL is the value to be provided to the destination operand memory location. In accordance with the prior art method this operation would require four memory cycles to complete, i.e., three memory cycles to read the source, destination and pattern operands, and one memory cycle to write the result back into memory.

From equation 3, if PAT=0, then DEST_VAL is equal to the value of SRC. To explain further, the first half of the operation (¯DEST AND PAT) will always be zero if PAT=0, i.e., (¯DEST) and 0=0.

Therefore, the final value DEST VAL is dependent on the second half of the operation, (SRC AND ¯PAT). However, since ¯PAT=1, the second half of the equation is equal to SRC, (SRC) AND 1=SRC.

Since the first and second halves of the equation are ORed together, the entire operation is equal to SRC or,

DEST_VAL=0 OR (SRC)=SRC.

If the source operand is equal to one (SRC=1), the value in the destination operand address is set to one. However, if the source operand is equal to zero (SRC=0), the value in the destination operand address is cleared.

Thus, only three memory cycles are required to perform the operation, the first to read the pattern operand, the second to read the source operand, and the third to clear or set the destination operand value.

It can be seen that for the same raster operation described, the number of memory cycles can also be reduced if PAT=1. Analyzing equation 3 for PAT=1, the first half of the operation will be equal to the complement of the destination operand (¯DEST) since it is ANDed with PAT or, (¯DEST) AND 1=¯DEST.

The second half of the equation will always be equal to zero inasmuch as the inverse of the pattern operand ¯PAT will be ANDed with the SRC operand. Since ¯PAT=0, (SRC) AND 0=0;

and ORing the first and second halves of equation 3 together results in:

DEST_VAL=(¯DEST) OR (0)=¯DEST.

Because the destination value is equal to the complement of the value already stored in the destination memory location, the memory logic can generate the raster operation result by complementing the destination operand. Thus, when PAT=1, there are still only three memory cycles required to determine the value for equation 3.

The present invention reduces the time required to perform certain raster operations by eliminating unnecessary logic operations. As can be seen from equation 3, inasmuch as the destination operand is not read by the image control processor, it does not have to be complemented before the raster operation is performed. When the bitblt memory toggles the destination operand, it replaces both the memory write cycle and the processor cycle required to complement the destination operand prior to performing the raster operation. Therefore, gate propagation delay time for some complex operations is eliminated by reduction in logic hardware.

Figure 3A:
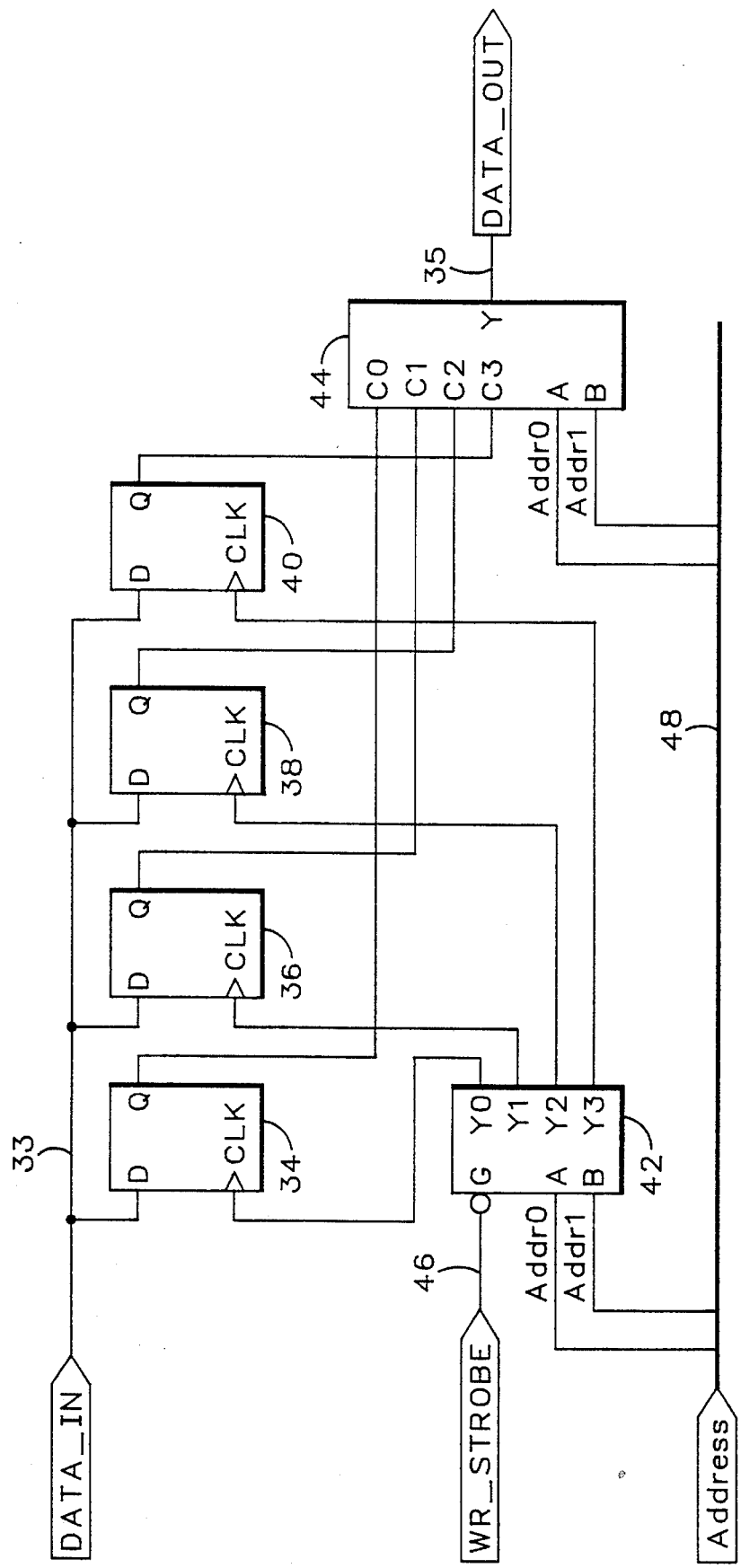
FIG. 3A is a block diagram of a circuit comprising a typical random access memory (RAM)

FIG. 3A illustrates conventional flip-flop circuitry as may be used for a small random access memory (RAM), or as a portion of a larger circuit. Address bus 48 is coupled to decoder 42 so that the least significant bit of the address (Addr0) is connected to decode input lead A and the next significant bit of the address (Addr1) is connected to decode input lead B. The address bus is also coupled to multiplexer 44 wherein the least significant bit of the address bus is connected to decode input lead A and the next least significant bit of the address bus is applied to decode input lead B. Write strobe line 46 is connected to gate input lead G of decoder 42. The Y0 output lead of decoder 42 drives the clock input lead of D flip-flop 34, while the remaining outputs at Y1 through Y3 serve as clock inputs for D flip-flops 36, 38 and 40 respectively.

Data input lead D of D flip-flop 34 receives data input line 33 as do the data input leads D of D flip-flops 36, 38 and 40. The Q output lead of D flip-flop 34 is connected to the C0 data input lead of multiplexer 44 and similarly the outputs of flip-flops 36, 38 and 40 are provided at multiplexer terminals C1–C3. The Y output of multiplexer 44 provides the data output on line 35.

To perform a write operation, the data value to be stored in memory is placed on data I/O line 33 and the memory cell (D flip-flop) which is to store the data value is activated via address bus 48. For example, to store a data value in the first memory cell (D flip-flop 34), the value on the address bus 48 is set equal to zero (Addr0=0, Addr1=0) so that when write strobe line 46 goes low, decoder 42 output Y0 will be active high for causing the clock input of D flop-flop 34 to latch the value on data I/O line 33. When the value on address bus 48 is one (Addr0=1, Addr1=0), D flip-flop 36 will store the value on data I/O line 33. Since the address on address line 48 is one, the value on decoder 42 input lead A is one while the value on decoder 4=2 input lead B is zero. Therefore, decoder 42 output lead Y1 will be high when write strobe line 46 is low, enabling D flip-flop 36 to latch the value on data I/O line 33.

For a read operation, it is desired to place the value in a selected memory cell on data output line 35. When write strobe line 46 is high, all outputs from decoder 42 are zero (Y0=Y1=Y2=Y3=0), whereby D flip-flops 34, 36, 38 and 40 retain their present values. If the data value from the third memory cell is to be read (D flip-flop 38), the value on address bus 48 is set to two (Addr0=0, Addr1=1). Therefore the value on input A of multiplexer 44 from the address bus is zero and the value on input B of multiplexer 44 is one, causing the multiplexer input C2 to be provided on output lead Y. Thus the value stored by D flip-flop 38 is supplied on data output line 35.

Figure 3B:
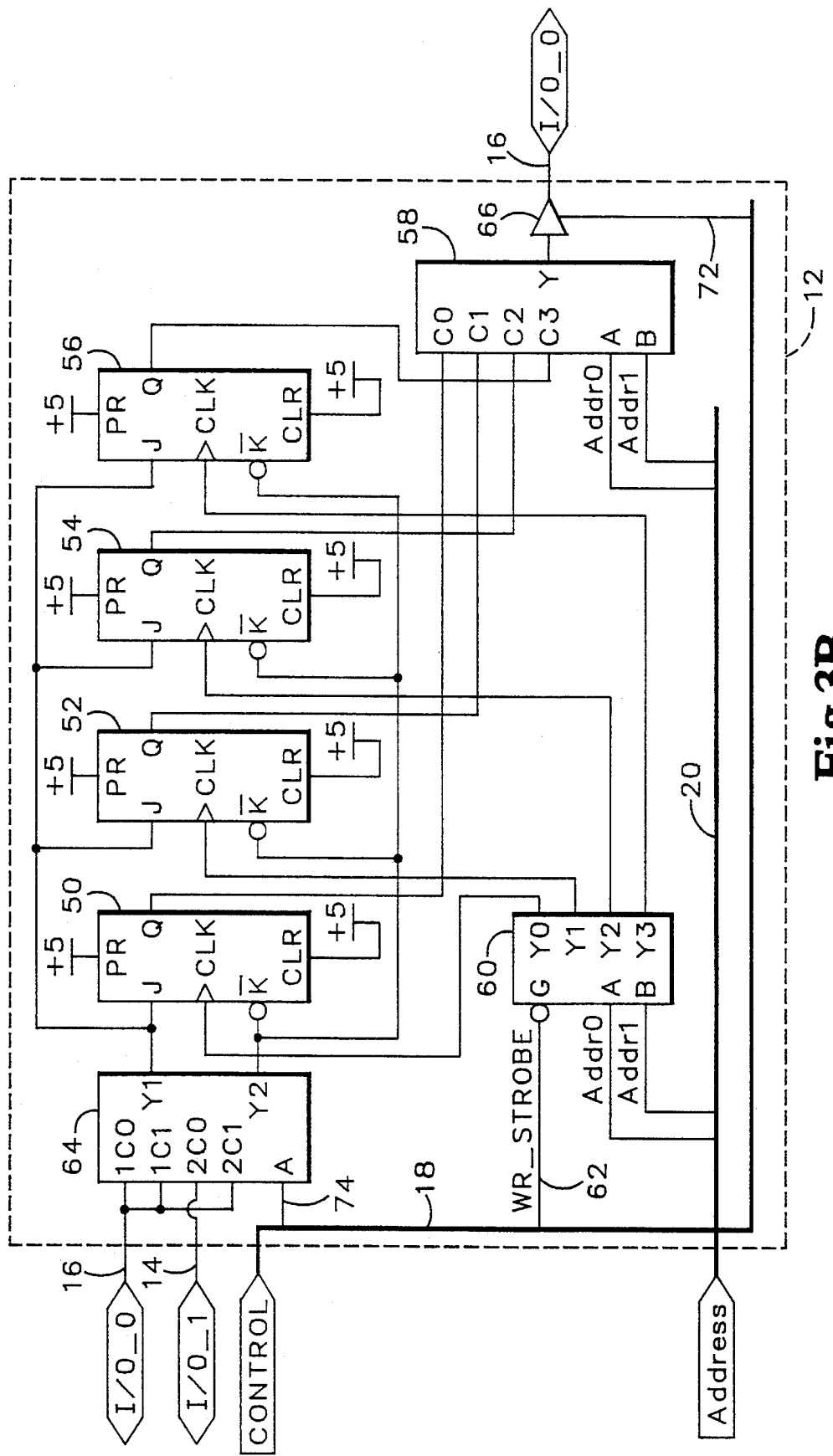
FIG. 3B is a block diagram of a circuit according to the present invention.

FIG. 3B illustrates circuitry employed according to the present invention comprising a random access memory capable of modifying the binary values stored in its data cells. While a single bit wide memory component is illustrated, the word length can be expanded to any size desirable. Referring to FIG. 3B, Bitblt RAM 12 includes address bus 20 that is connected to decoder 60 and to multiplexer 58, wherein the least significant bit of the address bus (Addr0) is connected to decoder 60 input lead A and to multiplexer 58 input lead A. The most significant bit on address bus 20 (Addr1) is applied to decoder 60 input lead B as well as to multiplexer 58 input lead B. Control bus 18 contains output enable line 72, Bitblt RAM/Standard RAM select line 74, and write strobe line 62. Write strobe line 62 drives gate input lead G of decoder 60, Bitblt RAM/Standard RAM select from line 74 is received at decode input lead A of multiplexer 64 and output enable line 72 enables tri-state driver 66.

Data I/O line 16 is applied to multiplexer 64 input leads 1C0, 1C1 and 2C1 but data I/O line 14 is individually connected to input lead 2C0 of multiplexer 64. Output Y1 of multiplexer 64 is coupled to the J inputs of J–K flip-flops 50, 52, 54 and 56 having their K inputs supplied from output Y2 of multiplexer 64. The preset and clear leads on J–K flip-flops 50, 52, 54 and 56 are returned to +5 volts. Output lead Y0 of decoder 60 is attached to the clock input lead of J–K flip-flop 50 while output leads Y1–Y3 are similarly disposed in driving relation to the clock inputs of J–K flip-flips 52, 54 and 56. The outputs of the flip-flops are received as inputs of multiplexer 58 wherein output lead Q of J–K flip-flop 50 is connected to the C0 input lead of multiplexer 58, the output lead Q of J–K flip-flop 52 is connected to multiplexer 58 input lead C1, J–K flip-flop 54 lead Q is coupled to multiplexer 58 input lead C2 and J–K flip-flop 56 output lead Q is connected to multiplexer 58 input lead C3. Output lead Y of multiplexer 58 feeds tri-state driver 66 and data I/O line 16.

When the circuit in FIG. 3B is used as a standard RAM, (e.g. just for writing data into memory or reading data out of memory), select line 74 is driven high for enabling the value on input lead 1C1 to be output on lead Y1 and the value on lead 2C1 (the same as the value on lead 1C1) to be output on lead Y2. To perform a standard RAM write operation, the value on data I/O line 16 is supplied to multiplexer 64 input lead 1C1 and multiplexer 64 input lead 2C1. Thus, multiplexer 64 output Y1 and multiplexer 64 output Y2 are both set to the value on data I/O line 16 and the J and K inputs to each of the J–K flip-flops are equal, causing each J–K flip-flop to store such value providing its input clock goes high. The input clock controls which J–K flip-flop will latch the value on data I/O line 16 in accordance with the address on address bus 20. For example, when the address bus value is zero (Addr0=0, Addr1=0) and the value on write strobe line 62 is low, the value on decoder 60 output lead Y0 is one causing J–K flip-flop 50 to latch the value on data I/O line 16. To store data in the second memory cell (J–K flip-flop 52), the value on address bus 20 is set to one (Addr0=1, Addr1=0) such that decoder 60 output Y1 goes high for enabling the second memory cell to latch the value on data I/O line 16. The remaining cells operate in a corresponding manner.

When the circuit is to perform as a "Bitblt RAM", the value on data I/O line 16 and the value on data I/O line 14 control the stored values in the four J–K flip-flops. For example, setting the value on select line 74 to zero enables the multiplexer 64 input 1C0 to output lead Y1 and the value on lead 2C0 to output lead Y2 whereby the value on data I/O line 16 is sent to the J lead of each memory cell and the value on data I/O line 14 is sent to the K lead of each memory cell. As described for a standard RAM write operation, the memory cell that is modified is the one selected by the address bus value.

FIG. 4 lists logic functions that may be performed by bitblt RAM 12 (written to a cell thereof) for given values on line 16 (I/O_0) and line 14 (I/O_1). When the signal on line 16 is equal to zero (I/O_0=0) and the signal on line 14 is equal to zero (I/O_1=0), the data value in the memory cell associated with the address value will be set to zero (cleared). When the signal on line 16 is equal to one (I/O_0=1) while the signal on line 14 is equal to zero (I/O_1=0), the data value is toggled, and if the signal on line 16 and the signal on line 14 are both equal to one (I/O_0=I/O_1=1), the data value is set to one. However, no logic operation is performed on the data value in memory if the signal on line 16 is equal to zero (I/O_0=0) and the signal on line 14 is equal to one (I/O_1=1).

Referring again to FIG. 3B, to clear the value in a memory cell, e.g. the second memory cell (J–K flip-flop 52), the value on address bus 20 is set to one (Addr0=1, Addr1=0), the value on data I/O line 16 is set to zero, and the value on data I/O line 14 is set to zero. The value on input lead J of J–K flip-flop 52 will be zero and the value on input lead K of J–K flip-flop 52 will be zero and since the preset and clear leads of J–K flip-flop 52 are both high, then on the rising edge of the clock input the data value in J–K flip-flop 52 will be set to zero.

As another example, when the value in the fourth memory cell (J–K flip-flop 56) is to be toggled, the value on data I/O line 16 is set to one (I/O_0=1), the value on data I/O line 14 is set to zero (I/O_1=0), and the value on address bus 20 is set to three (Addr0=1, Addr1=1). Since the value on the J input lead of J–K flip-flop 56 is one and the value on the K input lead of J–K flip-flop 56 is zero, the currently stored data value will be toggled, typically on the rising edge of the clock input, in a manner characteristic of J–K flip-flops.

A read operation is performed in a manner similar to the standard RAM mode in the Bitblt RAM mode. To perform the read, the value on write strobe line 62 is set to one, causing all outputs of decoder 60 to be set to zero (Y0=Y1=Y2=Y3=0) whereby the clock input lead for each memory cell is equal to zero. According to the decode logic of output multiplexer 58, the value on input lead C0 is output on lead Y when input lead A and input lead B are both zero. Since the output of J–K flip-flop 50 is connected to multiplexer 58 input lead C0, the value in the first memory cell will then be output by multiplexer 58 and placed on the input of tri-state driver 66. Thus, to read the value in memory cell 50, the value on address bus 20 is set to zero (Addr0=0, Addr1=0) and output enable line 72 is set to one causing tri-state driver 66 to place the output of flip-flop 50 on data I/O line 16. Operation is similar if any other cell is addressed.

FIG. 3C illustrates conventional charge storage circuitry as may be used for a small dynamic random access memory (DRAM), or as a portion of a larger circuit. Address bus 100 contains address lines Addr0 and Addr1 which are coupled to address decoder 78 input leads A and B respectively. Decoder 78 output Y0 feeds the gate of transistor 80, and similarly decoder 78 outputs Y1–Y3 feed the gates of transistors 84, 88 and 92. The source leads of transistors 80, 84, 88 and 92 are connected to data I/O line 102, while the corresponding drains of the four transistors are coupled to capacitors 82, 86, 90 and 94. The opposite lead of each capacitor is grounded. Data I/O line 102 and write strobe line 96 are both coupled to sense refresh amplifier 98.

FIG. 3D illustrates a typical DRAM sense refresh amplifier wherein sense amplifier 106 is connected to data I/O line 102 and outputs to D flip-flop 104. Data I/O line 102 is further coupled to the drain of transistor 108, while write strobe line 96 is connected to the gate of transistor 108. The output of flip-flop 104 connects to the source of transistor 108.

Referring back to FIG. 3C, when data is stored at a particular DRAM memory address, the corresponding address value is supplied on address lines Addr0 and Addr1. For example, when a value of one is to be stored at address location zero, the least significant address bit is zero (Addr0=0) and the next significant address bit is zero (Addr1=0). The value on decoder 78 output lead Y0 is set to one, causing transistor 80 to connect data I/O line 102 to capacitor 82. If the value on data I/O line 102 is zero, capacitor 82 will store a zero voltage, and when the value on data I/O line 102 is one, capacitor 82 will store a positive voltage. Address locations one, two and three are controlled in a manner whereby capacitor 86 stores the value on the data I/O line when the address value is one (Addr0=1, Addr1=0), capacitor 90 stores the input data value when the address value is two (Addr0=0, Addr1=1), and capacitor 94 stores the data value when the address value is three (Addr0=1, Addr1=1).

When a read operation is performed, the address location for the capacitor with the stored data is selected by placing the appropriate value on the address lines. For example, when address location two is read, the least significant address bit is set to zero (Addr0=0) and the next significant address bit is set to one (Addr1=1) enabling transistor 88 and discharging the stored voltage on capacitor 90 onto data I/O line 102. To regenerate the voltage on capacitor 90, refresh circuit 98 resupplies the previously stored voltage value. Referring to FIG. 3D, sense amplifier 106 detects the voltage level on data I/O line 102 and generates a logical one that is stored by D flip-flop 104 for a positive voltage level on line 102 and generates a logical zero that is stored by D flip-flop 104 for a zero voltage level on line 102. A high value on write strobe line 96 enables transistor 108 thereby coupling the output lead of D flip-flop 104 to data I/O line 102, causing the voltage level stored by D flip-flop 104 to be reloaded onto capacitor 90. The DRAM storage cells (capacitors 82, 86, 90, 94) are also refreshed periodically in a conventional manner using column address strobe (CAS) and row address strobe (RAS) control to prevent the storage capacitors from losing stored voltage values.

Figure 3E:
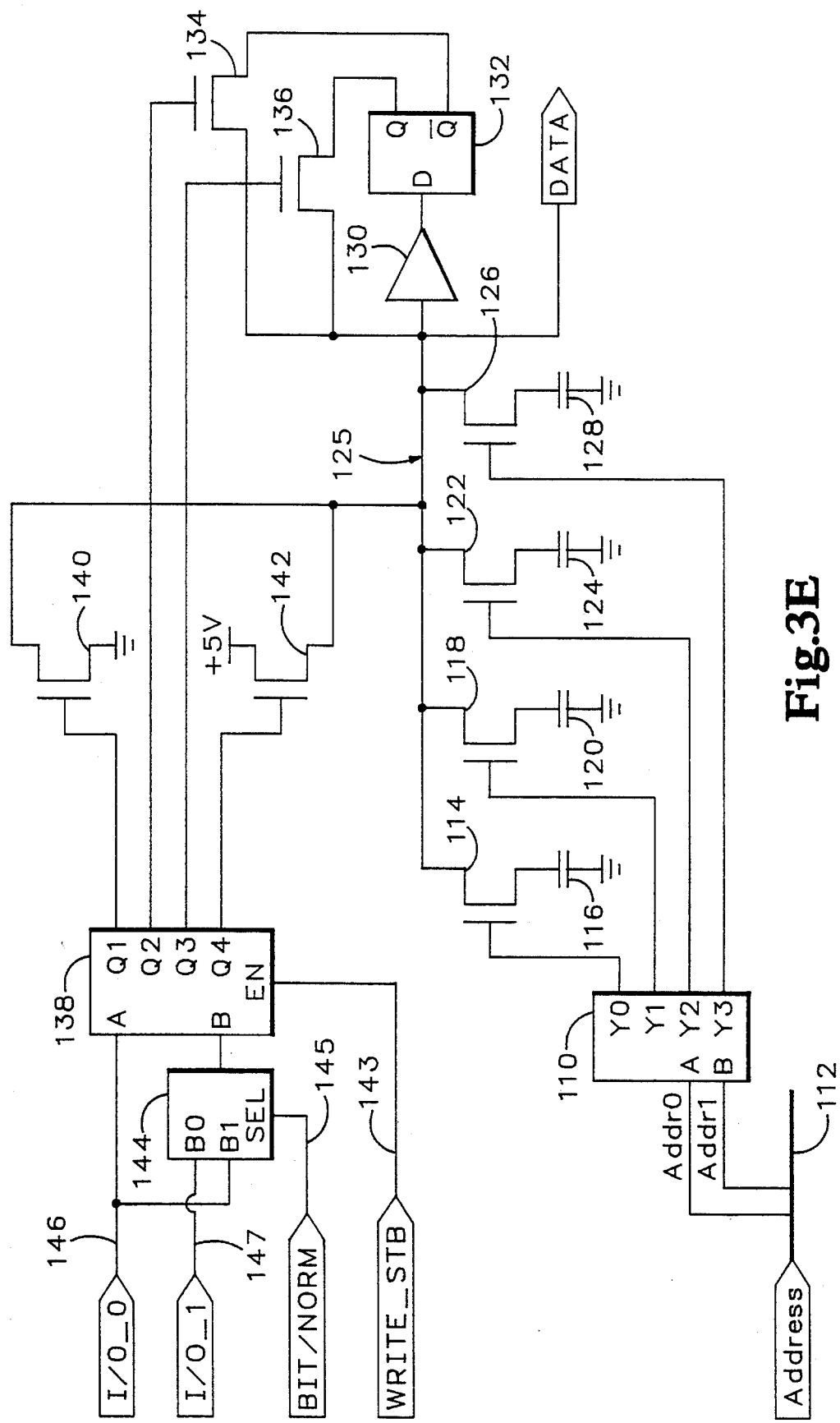
FIG. 3E is a diagram of another circuit according to the present invention.

FIG. 3E illustrates circuitry employed according to the present invention comprising a dynamic random access memory capable of modifying the voltage value stored in each capacitive storage cell. Data I/O line 146 is coupled to the A input lead of decoder 138 and to the B1 input lead of multiplexer 144. The remaining two inputs of multiplexer 144, input lead B0 and select lead SEL, are fed by data I/O line 147 and line 145 respectively, while the output of multiplexer 144 is coupled the B input lead of decoder 138. The enable lead on decoder 138 is connected to write strobe line 143, and the output leads of decoder 138 Q1, Q2, Q3 and Q4 are connected to the gates of transistors 140, 134, 136 and 142 respectively. Data line 125 couples the source of transistor 140 to the drains of transistors 134, 136 and 142, the sources of transistors 114, 118, 122 and 126 and to amplifier 130. The drain of transistor 140 is grounded and the source of transistor 142 is set to positive five volts. Address lines Addr0 and Addr1 are connected to decoder 110 input leads A and B respectively, while decoder outputs Y0–Y3 feed the gates of transistors 114, 118, 122 and 126. The first lead of capacitor 116 is coupled to the drain of transistor 114, with the second lead of capacitor 116 being grounded. The first leads on capacitors 120, 124 and 128 are coupled to the drains of transistors 118, 122 and 126 respectively, while the second leads on capacitors 120, 124 and 128 are grounded. Input lead D of D flip-flop 132 is coupled to the output of sense amplifier 130. Output lead Q is connected to the source of transistor 136 and output lead $Q^-$ is connected to the source of transistor 134.

To perform a standard DRAM write, write strobe line 143 is set to zero with select line 145 asserted high, causing data I/O line 146 to be coupled into the A and B inputs of decoder 138. When the value on line 146 is zero, decoder output Q1 is high, enabling transistor 140, thereby causing whichever capacitor that is coupled to the transistor enabled by the address bus value to be set to a zero voltage level. If the value on data I/O line 146 is one, decoder 138 output Q4 is asserted high enabling transistor 142, allowing the storage capacitor corresponding to the address value to be charged to a positive five volts. To switch the DRAM circuit into the Bit Ram mode, line 145 is asserted low, coupling data I/O line 147 to the B input lead of decoder 138. When data I/O line 146 and data I/O line 147 are equal, the Bit DRAM performs in a manner corresponding to a normal DRAM such that if line 146 and line 147 are both zero (clear), transistor 140 discharges the address enabled storage capacitor, and if line 146 and line 147 are both one (set), transistor 142 charges the storage capacitor enabled at the address value.

To toggle the value on a storage capacitor, data I/O line 146 is set to one and data I/O line 147 is set to zero, enabling transistor 134. For example, when the address value is three (Addr0=Addr1=1), transistor 126 is enabled, causing the voltage on capacitor 128 to feed sense amplifier 130. If a zero voltage exists on capacitor 128, sense amplifier 130 generates a logic zero that is stored by D flip-flop 132. Since transistor 134 is enabled, the complemented output of D flip-flop 132 (one) is fed back on line 125 through transistor 126 to capacitor 128. If initially a positive voltage exists on capacitor 128, sense amplifier 130 stores a one in D flip-flop 132. Transistor 134 similarly connects the complemented $Q^-$ output of D flip-flop 132 to line 125 causing capacitor 128 to be recharged with a zero voltage.

A read is performed when the value on data I/O line 146 is zero and the value on data I/O line 147 is one. However, when a read is not necessary, the DRAM still refreshes the capacitor enabled by the address value. For example, when the data value in address location two (Addr0=0, Addr1=1) is read, transistor 122 is enabled, discharging the voltage value on capacitor 124 onto data line 125. The voltage value on line 125 is output as data and is also fed into sense amplifier 130 which stores the detected voltage value into D flip-flop 132. A logic zero on data I/O line 146 and a logic one on data I/O line 147 enable transistor 136 connecting the Q output lead of D flip-flop 132 to data line 125. The voltage value previously discharged onto data line 125 which was stored by D flip-flop 132 is then resupplied on data line 125, recharging capacitor 124 with the value it initially held.

Figure 5:
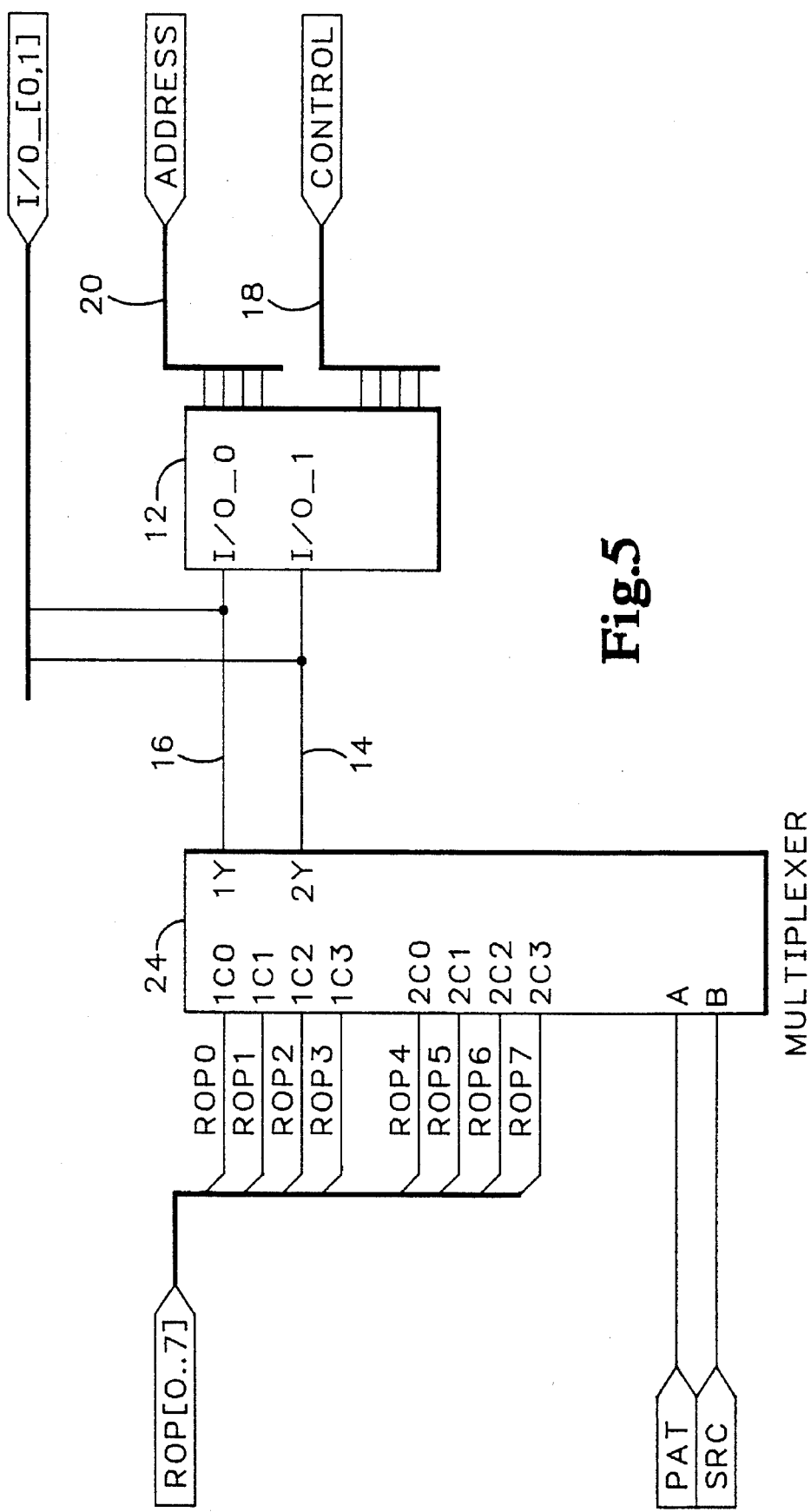
FIG. 5 is a block diagram of a bitblt hardware engine used in conjunction with a bitblt RAM.

In a general purpose image processor architecture, the values of control signals, addresses and the data on I/O lines can be supplied by a general purpose microprocessor. However, to reduce the time required to perform bitblts, a hardware "engine" is employed in association with the general purpose image processor. FIG. 5 illustrates a bitblt hardware engine suitably used in coordination with bitblt RAM 12 to reduce the time required to generate the values placed on line 14 and line 16 for directing logic functions as well as inputting data. The circuit exemplifies how a single bit of pixel data is processed during a bitblt operation for use in monochrome image display systems where each memory cell represents the image of an associated pixel. It is common to provide eight bit pixel data in color display systems to control the color and light intensity displayed on the screen and modifications of the FIG. 5 circuit will be discussed below for accommodating eight bit pixel data.

The circuit illustrates bitblt hardware for three operand raster operations but this system is easily simplified to accommodate two operand raster operations or expanded to facilitate raster operations that require more that three operands. Specifically, in FIG. 5, a raster opcode ROP[0 . . . 7], employed to define the particular raster operation desired is fed into multiplexer 24. The first bit of the raster opcode (ROP0) is connected to multiplexer 24 input lead 1C0, the second bit of the opcode (ROP1) is connected to multiplexer 24 input lead 1C1, the third bit (ROP2) is connected to multiplexer 24 input lead 1C2 and the fourth bit (ROP3) is connected to multiplexer 24 input lead 1C3. The remaining four bits of the raster opcode are coupled to the second input port of multiplexer 24 wherein the fifth bit of the raster opcode (ROP4) is connected to input lead 2C0, the sixth bit (ROP5) to input lead 2C1, the seventh bit (ROP6) to input lead 2C2, and the eighth bit (ROP7) to input lead 2C3. The pattern operand (PAT) is applied to multiplexer 24 input lead A while the source operand (SRC) is received at multiplexer 24 input lead B. The two operands, PAT and SRC, are input to multiplexer 24 to control decoding of the raster opcode.

When the value on lead A is zero and the value on lead B is zero, the signal on input lead 1C0 is output on lead 1Y and the signal on input lead 2C0 is output on lead 2Y. If the value on lead A changes to one while the value on lead B remains zero, the signal on input lead 1C1 is output on lead 1Y and the signal on input lead 2C1 is output on lead 2Y. Similarly, when A=0 and B=1, multiplexer 24 is configured so that 1C2=1Y and 2C2=2Y and when A=B=1, 1C3=1Y and 2C3=2Y. In accordance with the decode logic of multiplexer 24, when the pattern operand bit is zero (PAT=0) and the source operand bit is zero (SRC =0), the signal on lead 1C0 is output on lead 1Y and the signal on lead 2C0 is output on lead 2Y. Additional combinations of pattern and source operand values control the decode logic of multiplexer 24 in a similar manner.

Line 16 connects multiplexer 24 output lead 1Y to bitblt RAM 12 lead I/O_0 and line 14 connects multiplexer 24 output lead 2Y to bitblt RAM 12 lead I/O_1, line 16 and line 14 being further intercoupled with image control processor so it can read and write data directly into bitblt RAM 12. Address bus 20 and control bus 18 are operated by the processor. When the I/O values are supplied to bitblt RAM 12 from multiplexer 24, the logic operation performed by the bitblt RAM modifies the activated memory cell to reflect the result of the raster operation.

Any opcode to be performed during a bitblt is suitably encoded and placed in memory before the image processing system begins modifying pixel data. To explain further how raster operations are encoded, equation 3 will be used as an example. As explained in respect to equation 3, when the pattern operand is equal to zero (PAT=0), the destination value is equal to the source operand (DEST_VAL=SRC), and if the source operand is also equal to zero, the result of the raster operation is zero (DEST_VAL=0). To generate the equivalent of this raster operation in memory, a clear operation is performed at the address in bitblt RAM 12 where the destination operand is located. As described with respect to FIG. 4, for bitblt RAM 12 to perform a clear function, the value on lead I/O_0 is set to zero (I/O_0=0) and the value on lead I/O_1 is also set equal to zero (I/O_1=0). Since line 16 in FIG. 5 is connected to multiplexer output 1Y, and line 14 is connected to multiplexer output 2Y, both output 1Y and output 2Y must be zero in order to clear the RAM. According to the decode logic of multiplexer 24 as above described, when the value on input lead A and the value on input lead B are both zero, the value on input lead 1C0 is output on lead 1Y and the value on input lead 2C0 is output on lead 2Y. Inasmuch as raster opcode bit ROP0 is connected to multiplexer 24 input lead 1C0 and raster opcode bit ROP4 is connected to multiplexer 24 input lead 2C0, when SRC=0 and PAT=0, ROP0 will be output on 1Y and ROP4 will be output on 2Y. Therefore, the raster opcode associated with equation 3 is encoded so that ROP0 equals zero and ROP4 equals zero.

If the pattern operand used in equation 3 has a value of zero (PAT=0) but the source operand is equal to one (SRC=1), the destination value will still be equal to SRC; however, since the source operand has changed to one, the destination value is one (DEST_VAL=SRC=1). For these operand values, the raster opcode decoded by multiplexer 24 must command bitblt RAM 12 to set the bitblt memory to one. Such result is accomplished by setting the value on bitblt RAM lead I/O_0 equal to one (I/O_0=1) and setting the value on bitblt RAM lead I/O_1 equal to one (I/O_1=1) in this situation. According to the decode logic of multiplexer 24, when SRC=1 and PAT=0, the signal from raster opcode bit ROP2 will be output on output 1Y and the signal from raster opcode bit ROP6 will be output on output 2Y. Therefore, to set the memory cell value in bitblt RAM 12 to one, the third raster opcode bit must be equal to one (ROP2=1) and the seventh raster opcode bit must also be equal to one (ROP6=1).

The above encoding technique is used for the other opcode bits ROP1, ROP3, ROP5, and ROP7, in order to generate a raster opcode ROP[0 . . . 7] =01110010 for equation 3. This same type of encoding is predetermined for each logical operation that may take place during a bitblt, whereby a predetermined opcode and associated opcode address are stored in memory for each intended raster operation.

To perform the raster operation for implementing equation 3, the image control processor supplies an address to computer memory known to contain the associated raster opcode. The aforementioned eight bit raster opcode, ROP[0 . . .7]= 01110010, is retrieved and sent to the multiplexer 24 inputs 1C[0–3] and 2C[0–3], while the source operand is sent to multiplexer 24 input B and the pattern operand is provided at multiplexer 24 input A. (The source and pattern operands may be supplied from memory.) If the pattern operand is equal to one (PAT=1), the raster operation result is equal to the complement of the destination operand and therefore the destination operand memory location is toggled to generate the appropriate result. According to FIG. 4, this requires that the value on line 16 be set to one (I/O_0=1) and the value on line 14 be set to zero (I/O_1=0). If the source operand is equal to zero, the second raster opcode bit value is sent to multiplexer 24 output lead 1Y (ROP1=1Y) and the sixth raster opcode bit value is sent to multiplexer 24 output lead 2Y (ROP5=2Y), or 1Y=1 and 2Y=0. When the source operand is one (SRC=1) and the pattern operand is one (PAT=1), the raster result is still the complement of the destination operand (DEST_VAL= ¯DEST). Accordingly, when PAT=1 and SRC=1, the raster opcode is decoded by multiplexer 24 so that ROP3=1Y=1 and ROP7=2Y=0, which also toggles the value of the addressed data cell of bitblt RAM 12. The image control processor enables the bitblt RAM leads I/O_0 and I/O_1 as inputs by sending control signals over control bus 18. After the signals on lines 16 and 14 toggle the destination operand to equal the raster operation result, the image control processor reads the next source operand and the next pattern operand corresponding to another pixel in the bitblt pixel block. The raster opcode is decoded by multiplexer 24 with respect to the new operand values so that the addressed destination operand associated with the second pixel can be modified. The process is repeated until each pixel in the bitblt array has been modified as desired.

In aforementioned copending application entitled "SHORT CIRCUIT BLT" the time required to perform bitblts is also reduced by supplying a raster opcode to a multiplexer and decoding the opcode value in association with source, destination and pattern operands. This circuitry is advantageously employed in conjunction with the bitblt RAM according to the present invention. For example, a further pattern and a source operand decode circuit can be incorporated into the circuit in FIG. 5 to eliminate reading the source and pattern operands if it is not necessary to do so. Thus in equation 3 it was shown that when the pattern operand is equal to one (PAT=1) the result of the raster operation is the complement of the destination operand (DEST_VAL=¯DEST) whether the source operand is one or zero. Therefore, a signal can be sent to the image control processor when raster operands do not influence the result of a raster operation causing the processor to initiate the same opcode operation whether the source operand is one or zero. The source operand input to multiplexer 24 can merely be left in its previous state.

Figure 6A:
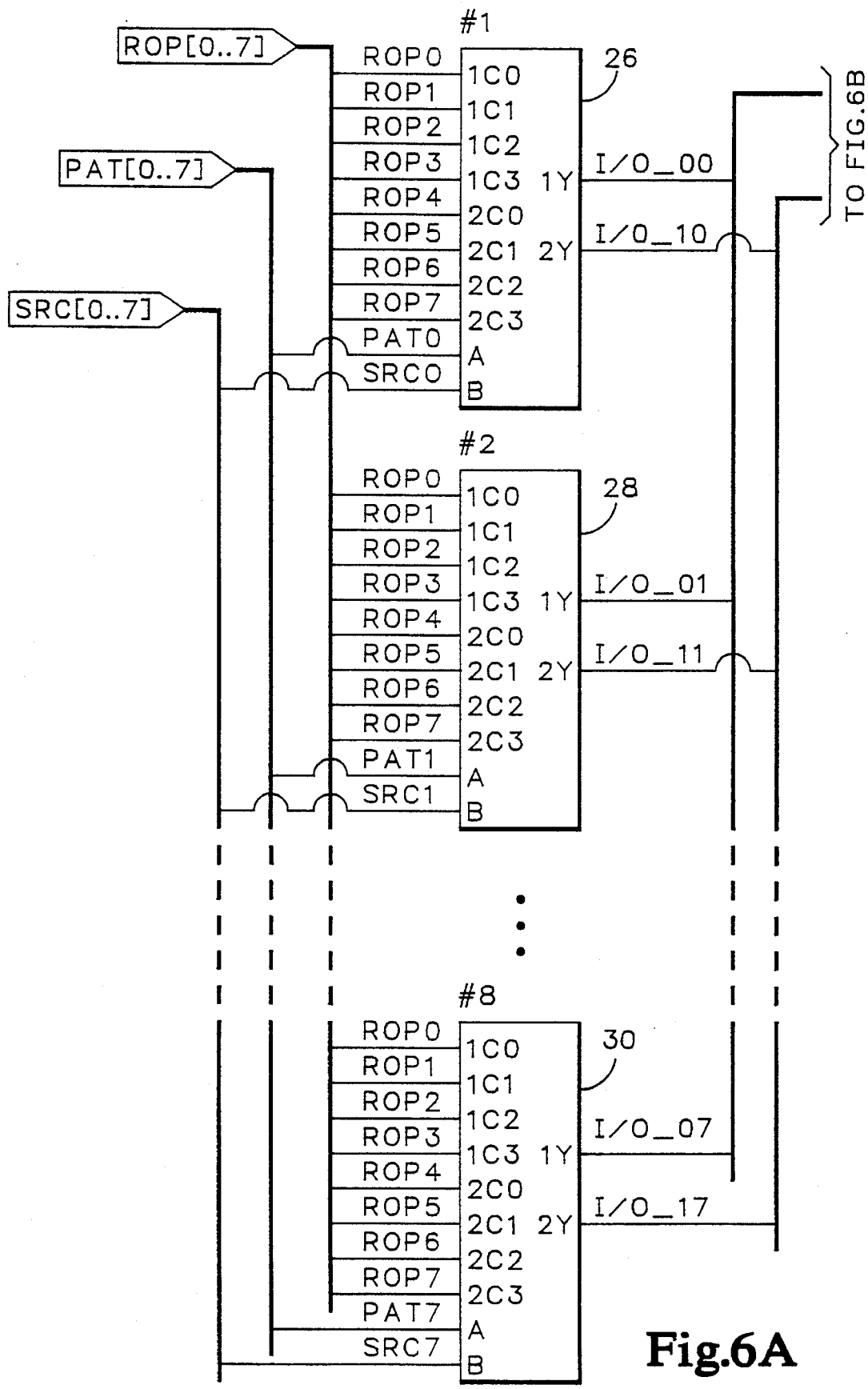
FIG. 6 is a block diagram of a bitblt hardware engine used for multi-bit pixel data.
Figure 6B:
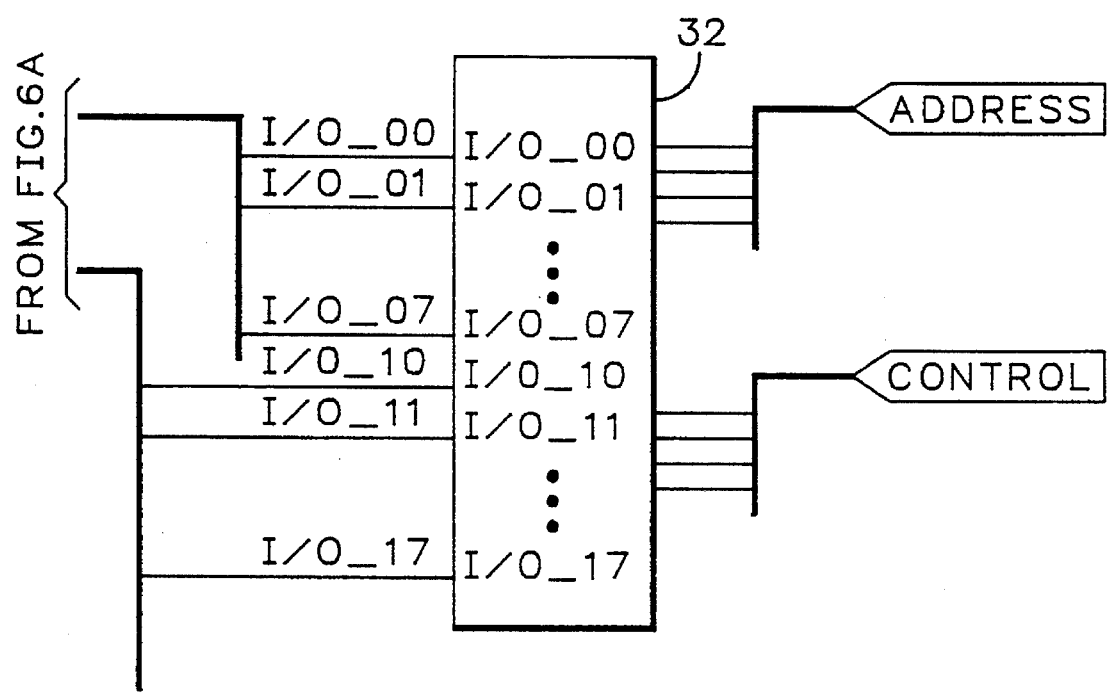

FIG. 6 performs the decoding operation accomplished by the FIG. 5 circuit, but for an eight bit pixel display. The raster opcode ROP[0 . . . 7] is fed to eight multiplexers, illustrated herein by multiplexer 26, multiplexer 28 and multiplexer 30. The first bit of the pattern operand (PAT0) is coupled to multiplexer 26, the second bit of the pattern operand (PAT1) is coupled to multiplexer 28 and so on until a last bit of the pattern operand (PAT7) is connected to multiplexer 30. The first bit of the source operand (SRC0) is similarly connected to multiplexer 26, the second bit to multiplexer 28, and the last bit to multiplexer 30. Bitblt RAM 32 in this image storage system is comprised of an eight bit wide memory cell array although the image storage system could alternatively use eight one bit wide memory components. The 1Y lead from multiplexer 26 is connected to bitblt RAM 32 lead I/O_00, while lead 2Y from multiplexer 26 is connected to bitblt RAM 32 lead I/O_10. Multiplexer 28 controls the second bit of the eight bit pixel word wherein lead 1Y is connected to bitblt RAM lead I/O_01 and lead 2Y is connected to bitblt RAM lead I/O_11. The remaining six multiplexers are connected to bitblt RAM 32 in a similar manner, each controlling a bit in the eight bit wide memory array. The bitblt hardware circuit shown in FIG. 6 operates in a manner similar to the hardware engine shown in FIG. 5 except the raster opcode is decoded by each operand bit simultaneously.

The invention can also be employed to increase the efficiency of an image processing system that does not use special bitblt circuitry of the type illustrated in FIGS. 5 and 6. A general purpose processor can perform a raster operation faster with a bitblt RAM according to the present invention than with general purpose memories, inasmuch as the destination operand does not have to be read. Furthermore, since there is one less operand needed to perform the raster operation, the processor can perform other parallel processing in place of logic operations accomplished within memory.

While preferred embodiments of the present invention have been shown and described, it will be apparent to those skilled in the art that many changes and modifications may be made without departing from the invention in its broader aspects. The appended claims are therefore intended to cover all such changes and modifications as fall within the true spirit and scope of the invention.

I claim:

1. An electronic data storage system for effecting a selected algebraic operation between previously stored data and source data, and for storing the result in place of the previously stored data, wherein the result is predictable independently of accessing the value of the previously stored data, said system comprising:

a memory cell array for storing binary data, a memory cell thereof including memory cell modification means for performing logic operations within a said cell, data storage selection means for accessing a cell in said array, data input means for receiving source data adapted for algebraic combination with the previously stored data in said cell, and control input means responsive to the selected algebraic operation for controlling said memory cell modification means to perform a said logic operation in the accessed memory cell to selectively change the previously stored value in said memory cell in accordance with the data input and the algebraic operation.

2. An electronic data storage system for effecting a selected algebraic operation between previously stored data and source data, and for storing the result in place of the previously stored data, wherein the result is predictable independently of accessing the value of the previously stored data, said system comprising:

a memory cell array for storing binary data, a memory cell thereof including memory cell modification means for performing logic operations within a said cell, data storage selection means for accessing a cell in said array, data input means for receiving source data adapted for algebraic combination with the previously stored data in said cell, and control input means responsive to the selected algebraic operation for controlling said memory cell modification means by controlling said data input means to cause said modification means to perform a said logic operation in the accessed memory cell to selectively change the previously stored value in said memory cell in accordance with the data input and the algebraic operation.

3. A dynamic random access memory system for effecting a selected algebraic operation between previously stored data and source data, and for storing the result in place of the previously stored data, wherein the result is predictable independently of accessing the value of the previously stored data, said system comprising:

a memory cell array for storing voltage levels representing binary data, a memory cell refresh means including memory cell modification means for performing logic operations within a said cell, data storage selection means for accessing a cell in said array, data input means for receiving source data adapted for algebraic combination with previously stored data in said cell, and control input means responsive to the selected algebraic operation and coupled to said array and refresh means for controlling said memory cell modification means to perform a said logic operation in the accessed memory cell to selectively change the previously stored value in said memory cell in accordance with the data input and the algebraic operation.

4. An electronic data storage system according to claim 1 wherein said control input means include a pair of cell input lines, the logic operations of said modification means being determined by the combination of signal levels on said input lines.

5. An electronic data storage system according to claim 1 wherein logic operations of said modification means comprise set to one, set to zero, complement and no change functions.

6. An electronic data storage system according to claim 1 wherein the cells of said array comprise flip-flops and said modification means for a cell comprise input means coupled to respective feedback connected stages of a said flip-flop.

7. An electronic data storage system according to claim 4 wherein said flip-flops comprise J-K flip-flops.

8. An electronic data storage system for effecting an algebraic operation between stored data and source data and without having to extract the stored data from its location, said electronic data storage system comprising:

an array of J-K flip-flops for storing data, and selection means for accessing a specific J-K flip-flop in said array.

9. An electronic data storage system according to claim 1 wherein the logic operations of said modification means are determined by the combination of logic signal levels on said data input means, said data input means comprising a first input line and a second input line.

10. An electronic data storage system according to claim 1 wherein said control input means controls a pair of data input lines of said data input means, the logic portions of said modification means being determined by the combination of signal levels on said input lines.

11. An electronic data storage system according to claim 1 wherein logic operations of said modification means comprise set to one, set of zero, complement and no change functions.

12. An electronic data storage system according to claim 1 wherein the cells of said array comprise capacitors and said modification means for a cell comprise input means coupled to respective feedback connected stages of said memory cell refresh means.

13. An electronic data storage system according to claim 1 wherein the memory cell refresh means comprise a voltage level sensing means for detecting an input voltage level, a voltage level storage means for storing the detected voltage level, and voltage level storage feedback means to feedback one of said stored voltage level and inverted voltage level to said memory cell array.

* * * * *